(12) United States Patent  (10) Patent No.: US 7,214,570 B2
Guenther  (45) Date of Patent: May 8, 2007

(54) ENCAPSULATING A DEVICE (75) Inventor: Ewald Karl Michael Guenther, Singapore (SG)

(73) Assignee: Osram GmbH, Munich (DE)

( * ) Notice: Subject to any disclaimer, the term of this patent is extended or adjusted under 35 U.S.C. 154(b) by 162 days.

(21) Appl. No.: 11/046,389

(22) Filed: Jan. 27, 2005

(65) Prior Publication Data

US 2005/0136571 A1  Jun. 23, 2005

Related U.S. Application Data

(62) Division of application No. 09/787,400, filed as application No. PCT/SG99/00073 on Jul. 9, 1999, now Pat. No. 6,888,237.

(51) Int. Cl.
*H01L 21/20* (2006.01)

(52) U.S. Cl. ............... 438/141; 438/513; 438/687; 438/680; 257/E21; 257/53; 257/352; 257/368; 257/17

(58) Field of Classification Search ........... 438/141, 438/48, 64, 51, 54, 106, 112, 124, 125, 126, 438/127, 678, 679, 680, 681, 692, 30, 733, 438/734
See application file for complete search history.

(56) References Cited

U.S. PATENT DOCUMENTS

| | | | |
|---|---|---|---|
| 4,287,285 A | 9/1981 | Mosehauer | |
| 4,501,637 A | 2/1985 | Mitchell et al. | |
| 4,720,432 A | 1/1988 | VanSlyke et al. | |
| 4,746,392 A | 5/1988 | Hoppe | |
| 4,767,679 A | 8/1988 | Kawachi | |
| 5,022,554 A | 6/1991 | Heeter et al. | |
| 5,276,381 A * | 1/1994 | Wakimoto et al. ......... 313/504 | |
| 5,408,109 A | 4/1995 | Heeger et al. | |
| 5,693,956 A | 12/1997 | Shi et al. | |
| 5,742,129 A * | 4/1998 | Nagayama et al. ......... 315/167 |
| 5,781,169 A | 7/1998 | Kuijk et al. | |
| 5,804,917 A | 9/1998 | Takahashi et al. | |
| 5,844,363 A | 12/1998 | Gu et al. | |
| 5,920,080 A | 7/1999 | Jones | |
| 6,069,443 A | 5/2000 | Jones et al. | |
| 6,175,186 B1 | 1/2001 | Matsuura et al. | |
| 6,198,217 B1 | 3/2001 | Suzuki et al. | |
| 6,268,695 B1 | 7/2001 | Affinito | |

(Continued)

FOREIGN PATENT DOCUMENTS

FR  2 585 510 A1  1/1987

(Continued)

OTHER PUBLICATIONS

Burroughs, J.H. et al., Nature: "Light-Emitting Diodes Based on Conjugated Polymers", Oct. 11, 1990, vol. 347, pp. 539-541.

(Continued)

*Primary Examiner*—David Nhu
(74) *Attorney, Agent, or Firm*—Fish & Richardson P.C.

(57) ABSTRACT

An encapsulation for an electrical device is disclosed. A cap support is provided in the non-active regions of the device to prevent the package from contacting the active components of the device due to mechanical stress induced in the package.

19 Claims, 7 Drawing Sheets

U.S. PATENT DOCUMENTS

| | | |
|---|---|---|
| 6,278,237 B1 | 8/2001 | Campos |
| 6,309,901 B1 | 10/2001 | Tahon et al. |
| 6,592,969 B1 | 7/2003 | Burroughs et al. |
| 6,600,175 B1 | 7/2003 | Baretz et al. |
| 6,949,825 B1 * | 9/2005 | Guenther et al. ........... 257/725 |

FOREIGN PATENT DOCUMENTS

| | | |
|---|---|---|
| GB | 2 028 719 A | 3/1990 |
| JP | 58-39075 A | 3/1983 |
| TW | 155504 | 4/1991 |
| TW | 449938 | 8/2001 |
| WO | WO01/04938 A1 | 1/2001 |
| WO | WO 01/05205 A1 | 1/2001 |

OTHER PUBLICATIONS

Harper, Charles A., Electronics Packaging and Interconnection Handbook, 1991, McGraw-Hill, Inc., pp. 1.22-1.23, 1.40-1.42.

* cited by examiner

ENCAPSULATING A DEVICE

CROSS-REFERENCE TO RELATED APPLICATIONS

This application is a divisional and claims the benefit of priority under 35 U.S.C. Section 120 of U.S. application Ser. No. 09/787,400, filed on Feb. 13, 2002, U.S. Pat. No. 6,888,237 which claims priority to International Application Serial No. PCT/SG99/00073, filed Jul. 9, 1999. The disclosure of the prior applications are considered part of and are incorporated by reference in the disclosure of this application.

BACKGROUND

The present invention relates to device encapsulation. In device fabrication, one or more device layers are formed on a substrate. The layers are sequentially deposited and patterned to create features on the surface of the substrate. The layers can be patterned individually and/or as a combination of layers to form the desired features. The features serve as components that perform the desired functions, creating the device.

One type of device which is of particular interest is a light emitting diode (LED). LEDs can have a variety of applications. For example, a plurality of LED cells or pixels can be formed on a substrate to create a pixelated LED device for use as a display, such as a flat panel display (FPD).

Typically, an LED pixel comprises one or more functional layers sandwiched between two electrodes to form a functional stack. Charge carriers are injected from both electrodes. These charge carriers recombine in the functional layer or layers, causing visible radiation to emit. Recently, significant advances have been made utilizing organic functional layers to form organic LEDs.

To protect the LED pixels from the environment such as moisture and/or air, the device is encapsulated with a package. Conventionally, LED packages comprises various kinds of cavity packages. The cavity packages typically comprise mounting a lid on the substrate. The cavity protects the organic LED pixels from being damaged by the package since they are very sensitive to pressure. Further, the cavity also enables the placement of desiccant material to cope with finite leakage rate of the device.

Flexible devices formed on thin or flexible substrates are being contemplated for new applications, such as flexible displays. However, conventional device packaging is not amenable to being flexible. This makes it difficult to satisfy the flexibility requirement of flexible devices, particularly those having relatively large surface areas such as displays.

As evidenced from the above discussion, it is desirable to provide an effective package for devices, particularly those formed on thin or flexible substrates.

SUMMARY

The invention relates to encapsulating devices.

In one aspect, the invention relates to a method for fabricating a device. A substrate is provided. One or more active and non-active regions are defined on the substrate so that at least one non-active region is between two or more active regions and each of the active regions includes an active component. The active regions are encapsulated with a cap supported by a cap support, the cap support located in the non-active region and in a periphery of the device. The substrate, cap support and cap together form a flexible device.

In one embodiment, a cap support on which a cap is mounted is provided. The cap support surrounds the periphery of the device and in at least one of the non-active regions. The cap support in the non-active regions are particularly useful for flexible devices since they provide support for the cap to prevent it from contacting the active components due to stress induced by bending.

DETAILED DESCRIPTION

The invention relates generally to the fabrication of devices. In particular, the invention provides a cost effective package for encapsulating devices, particularly those formed on flexible or thin substrates.

Figure 1:
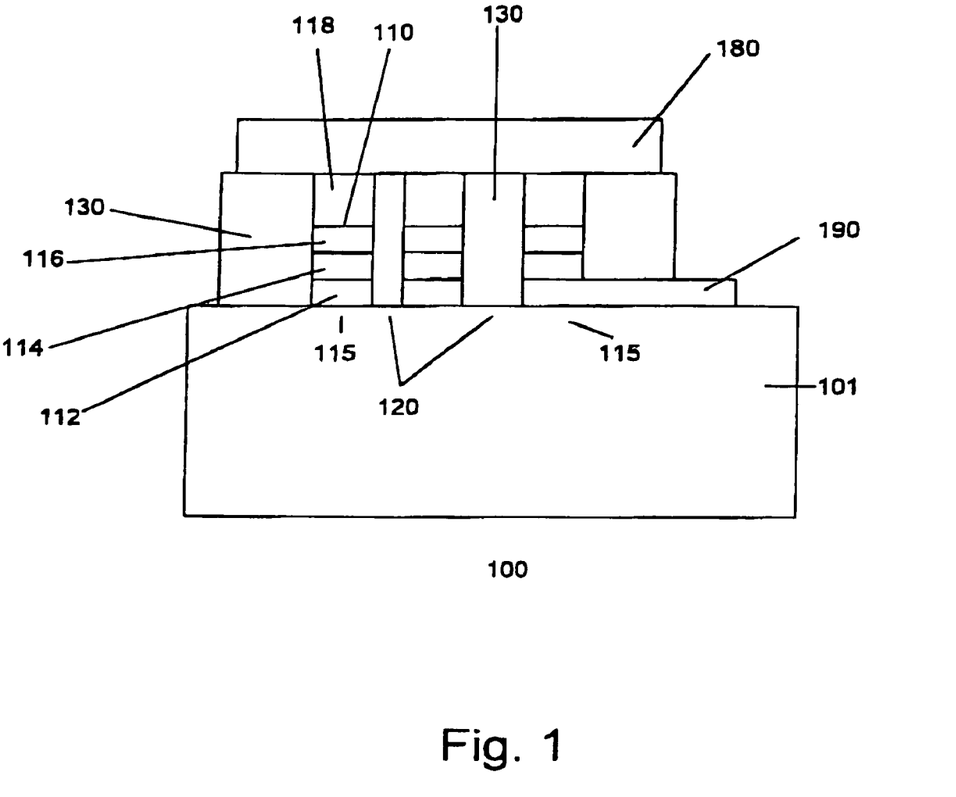
FIG. 1 shows an embodiment of the invention.

FIG. 1 shows a device 100 in accordance with one embodiment of the invention. The device can be, for example, an electrical, a mechanical, an electromechanical device, or a microelectromechanical system (MEMS). The device comprises one or more active components 110 formed on a substrate 101. In one embodiment, the active components are formed on active regions 115 of the substrate. Non-active regions 120 are provided on the substrate. As shown, the non-active regions separates the active components.

A cap support 130 is provided on the periphery of the device surrounding the active components. A cap 180 rests on the cap support. The cap hermetically seals the active components from the environment. The cap support elevates the cap to prevent it from contacting the active components.

The cap support also provide support in non-active regions of the device. As shown, the cap support comprises support posts located in the non-active regions. Since the cap support is situated in the non-active regions, the functionality of the active components are unaffected. Locating support posts in the non-active regions provides additional support to the central portion of the cover layer. This prevents the cap from collapsing onto the active components due to stress. This is particularly useful for flexible devices.

In one embodiment, the device 100 comprises an electrical device. The electrical device comprises a pixelated organic LED device. Organic LED devices are described in, for example, U.S. Pat. No. 4,720,432 and Burroughes et. al, Nature 347 (1990) 539, which are herein incorporated by reference for all purposes. Other types of electrical devices which are formed on a substrate, such as semiconductor lasers, are also useful.

The active components 110 include organic LED pixels. An organic LED pixel comprises at least one organic layer 114 between first and second electrodes 112 and 116. The pixels are, for example, configured in an array to form a display, such as an FPD. FPDs are used in various consumer electronic products, including cellular phones, cellular smart phones, personal organizers, pagers, advertising panel, touch screen displays, teleconferencing equipment, multimedia equipment, virtual reality products, and display kiosks.

The pixels 110 are located on the active regions 115 of the substrate 101 and are separated by the non-active regions 120. Support posts 130 are located in the non-active regions of the substrate and in the periphery of the device surrounding the LED pixels. The support posts can be provided in one, some, or all the non-active regions. A cap 180 is mounted on the support posts to encapsulate the device in order to protect the pixels from air and/or moisture. Pads 190 coupled to the LED pixels can be provided. The pads enable external connections to the device.

The cap support serves to prevent the cap from contacting the LED pixels. The LED pixels can be damaged if the cap comes into contact with the LED pixels. In one embodiment, the height of the cap support creates a gap or cavity 118 between the surface of the LED pixels and cap. The gap should be sufficient to prevent the cap from contacting the LED pixels.

Typically, the gap is about 1–10 um in height. Of course, the gap height can vary due to the amount of stress induced (e.g., amount of bending required from the device, thickness of the cover layer, and lateral distance between support posts).

FIGS. 2a–2e show a process for fabricating a device in accordance with one embodiment of the invention. The device comprises, for example, an organic LED.

Figure 2A:
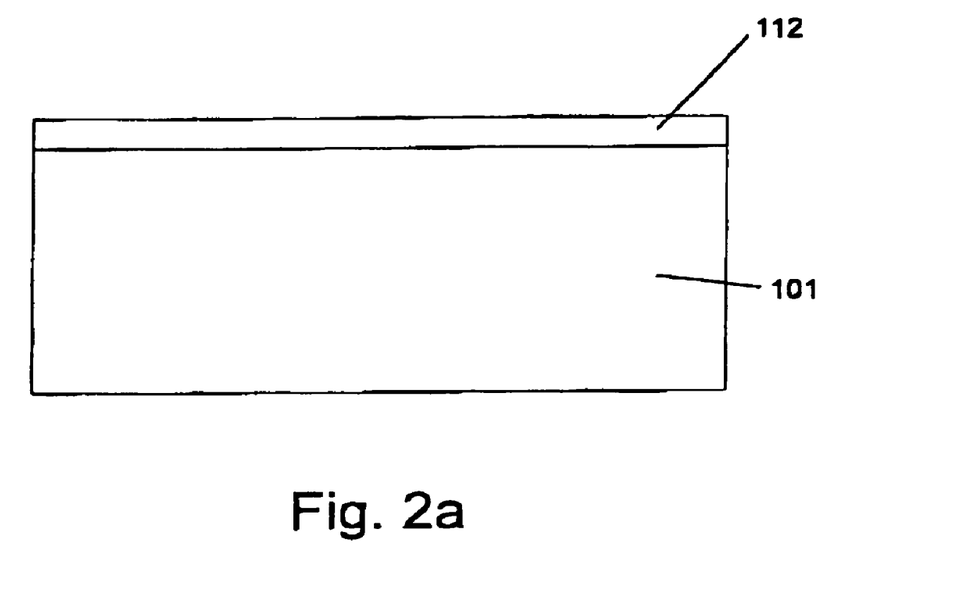
FIGS. 2a–2e show a process for fabricating an electronic device in accordance with one embodiment of the invention.

Referring to FIG. 2a, a substrate 101 is provided on which the active components of the device are formed.

The substrate can comprise various types of materials, such as glass or a polymer for supporting the active components. Other materials which adequately support the active components, such as ceramic or silicon, can also be used. Various types of semiconductor wafers are also useful.

In one embodiment, a flexible substrate is provided for fabricating a flexible device. The flexible substrate comprises a flexible material such as a plastic film. Various commercially available plastic films are useful. Such films, for example, include transparent poly (ethylene terephthalate) (PET), poly (butylene terephthalate) (PBT), poly (enthylene naphthalate) (PEN), Polycarbonate (PC), polyimides (PI), polysulfones (PSO), and poly (p-phenylene ether sulfone) (PES). Other films such as polyethylene (PE), polypropylene (PP), poly (vinyl chloride) (PVC), polystyrene (PS) and poly (methyl methyleacrylate) (PMMA), can also be used.

In one embodiment, the flexible substrate should be thin to result in a thin device while providing sufficient mechanical integrity during the fabrication process to support the active components. Preferably, the flexible substrate should be as thin as possible while providing sufficient mechanical integrity during the fabrication process. In one embodiment, the flexible substrate is about 20–200 um thick.

In an alternative embodiment, the flexible substrate comprises glass. Thin semiconductor substrates or other thin flexible substrates can also be useful. In one embodiment, the thickness of the substrate is about 30–300 um.

In another embodiment, temporary support layers can be provided. The temporary support layers, for example, can be formed on the backside of the substrate to provide the support necessary during the fabrication process. The package can be used to provide additional support to stabilize the substrate at the final product stage, enabling the temporary layer to be removed.

Temporary support layers allow the use of thinner substrates, resulting in thinner devices.

Active and/or non-active regions are defined on the substrate surface. The active regions provide areas on the substrate on which active components are formed.

Various techniques can be used to define the active and/or non-active regions. For example, photolithographic techniques can be used to define the active and/or non-active regions.

In one embodiment, the active components comprise organic LED pixels. The organic LED pixels are arranged to form a pixelated device. A pixelated organic LED device includes, for example, a plurality of first electrode strips formed on the substrate. The strips are arranged in a first direction. One of more organic layers are formed on the first electrodes strips. A plurality of second electrode strips is formed over the organic layers in a second direction. Typically, the first and second electrode strips are orthogonal to each other. The intersections of the first and second electrode strips form LED pixels. In one embodiment, the non-active regions are represented by the areas which, when viewing the substrate from the top, exclude electrode materials. Alternatively, regions in which the electrodes do not intersect can be considered non-active regions.

Figure 2B:
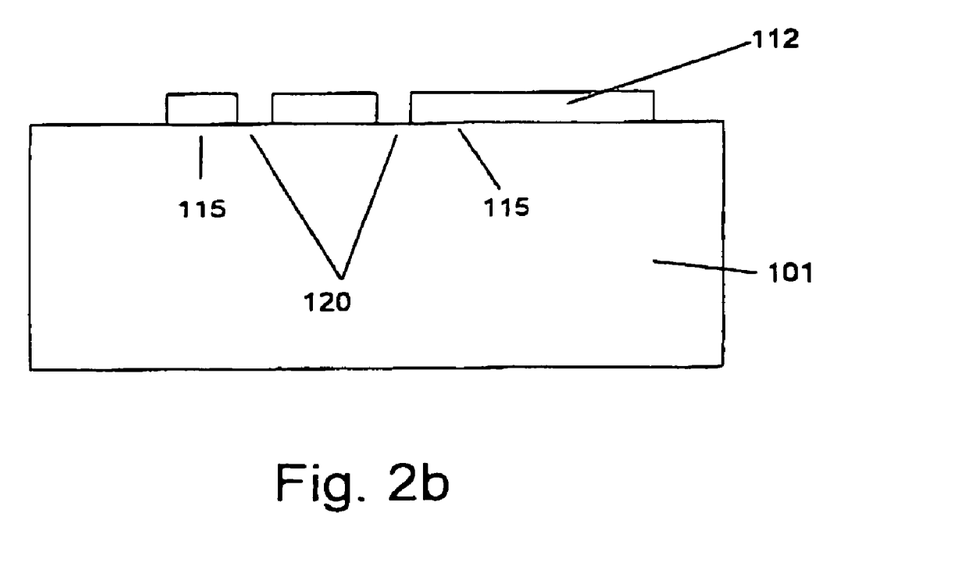

Referring to FIG. 2b, the process of defining the active and/or non-active regions commences. In one embodiment, a device layer 112 is formed on the substrate. The device layer comprises, for example, a conductive layer. Other types of device layers are also useful, depending on the type of active components. The thickness of the device layer, for example, is about 0.1–1 um. The thickness, of course, can be varied according to design requirements.

In one embodiment, the device layer comprises a transparent conductive layer that serves as anodes for the LED pixels. The transparent conductive layer comprises, for example, indium-tin-oxide (ITO). Other types of transparent conductive layers such as zinc-oxide and indium-zinc-oxide are also useful. Various techniques, such as chemical vapor deposition (CVD) physical vapor deposition (PVD), and plasma enhanced CVD (PECVD), can be employed to form the device layer. The conductive layer should be thin to reduce optical absorption and negative impact on subsequent film formation while satisfying electrical requirements. In one embodiment, the conductive layer comprises a thickness of about 100 nm.

After the device layer is formed, it is patterned to define the active and/or non-active regions. Conventional techniques, such as photolithography and etching, can be used to pattern the device layer. Patterning techniques using a stamp are also useful. Such techniques are described in concurrently filed international patent application titled "Mechanical Patterning of a Device Layer" (attorney docket number 99E 8062), which is herein incorporated by reference for all purposes. The active regions comprise, for example, the portions of the device layer remaining on the substrate surface and the non-active regions comprise portions of the exposed substrate surface.

In one embodiment, the conductive layer is patterned to form bottom electrode strips on the surface of the substrate to serve as the bottom electrodes of the LED pixels. The active regions comprise portions of the bottom electrode strips on which LED pixels are formed. The portions of the exposed substrate surface which, when viewed from the top, would not be occupied by the second electrode strips of the LED pixels are, for example, the non-active regions.

Figure 2C:
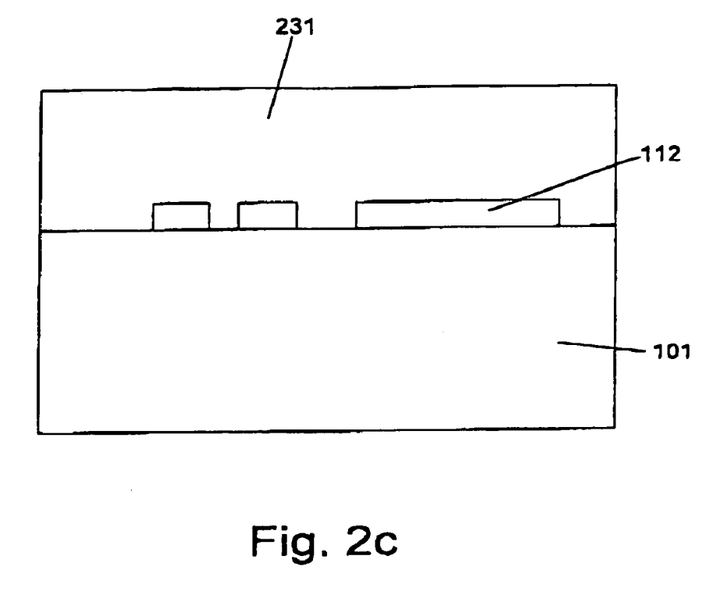

Referring to FIG. 2c, a spacer layer 231 is deposited on the surface of the substrate. The spacer layer provides the material to form the cap support.

The thickness of the spacer layer is equal to about the height of the cap support. In one embodiment, the thickness of the spacer layer is greater than a height of the subsequently formed active components to create a cavity between the active component and the cap. This protects the active components from being damaged by the cap. Typically, the height of the cavity is about 1–10 microns.

In one embodiment, the spacer layer comprises a dielectric material to electrically isolate the active regions. The spacer layer can comprise directly or indirectly patternable materials. Preferably, the spacer layer comprises a photopatternable or photosensitive material that can be directly patterned.

Photopatternable materials include, for example, photosensitive polyimide, photosensitive polybenzoxazole, photoresists, photoresists based on novolac systems, and dry film resist materials. Photoresists based on novolac systems can be used, because they can be cured and crosslinked to provide improved mechanical integrity over other types of non-curable resists. Indirect patternable materials include, for example, spin-on glass materials, polyimide, polybenzoxazole, polyglutarimide, benzocyclobutene, polymers such as polyethylene (PE), polystyrene (PS), polypropylene (PP), or inorganic materials such as $SiO_2$, $Si_3N_4$, and $AL_2O_3$.

Alternatively, the spacer layer can comprise a multi-layer architecture. For multi-layer spacer architectures, the lower portion comprises dielectric characteristics for isolating the anode electrodes of the LED pixels. If isolation is not necessary, the lower portion need not comprise dielectric characteristics. The upper portion can comprise various materials such as a metal. The use of a multi-layer spacer architecture can be advantageous since the upper portion can be selected to comprise a material that enhances sealing with a cap or encapsulation layer. For example, metals like Al, W, Ni, Cr, Co, Ag, Pt are useful as they facilitate good adhesion with a metallic cap. Polymers, such as PE, PP, PS, can be used to form the upper portion to provide good adhesion facilitate with a polymeric, a glass, or a metallic cap. The upper and lower portions can include one or more layers. The total thickness of the layers is equal to about the desired height of the support posts.

The surface of the spacer layer may be planarized by, for example, chemical mechanical polishing (CMP) for subsequent processing. Providing a planar surface may be useful, particularly for devices having small features such as below 0.25 um.

Figure 2D:
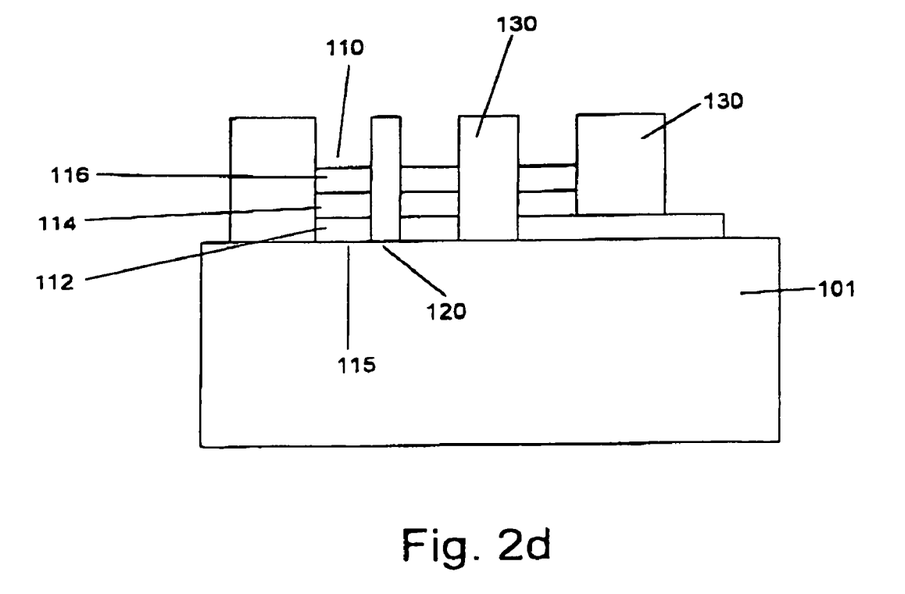

Referring to FIG. 2d, the spacer layer is patterned to form the cap support 130 in the non-active regions 120 and the periphery of the device. Since the support posts are formed in the non-active regions, they do not interfere with the functionality of the active components.

Active components 110 are formed in the active regions 115. In one embodiment, organic LED pixels are formed in the active regions. Formation of the organic LED pixels includes, for example, depositing one or more organic layers 114 on the substrate. The organic layers comprise, for example, conjugated polymer or $Alq_3$. Other types of organic layers can also be useful. The thickness of the organic layers is typically about 2–200 nm.

The organic layers cover the bottom electrode strips as well as the support posts. The portions of the organic layers covering the support posts can be removed if necessary. Selective removal of the organic layers can be achieved using, for example, polishing. Other techniques for selective removal of the organic layers, such as etching, scratching, or laser ablation, can also be used.

Top electrode strips are then deposited on the substrate. The top electrode strips comprise a conductive material such as, for example, Ca, Mg, Ba, Ag or a mixture there of. Other conductive materials which comprises a low work function can also be useful. The top electrode strips are typically orthogonal to the bottom electrode strips. Forming top electrode strips that are diagonal to the bottom electrode strips is also useful. Selective deposition can be used to form the top electrode strips. Alternatively, the electrode strip can be formed by selectively patterning a top electrode layer to form the strips. The intersections of the top and bottom electrode strips form organic LED pixels.

Figure 2E:
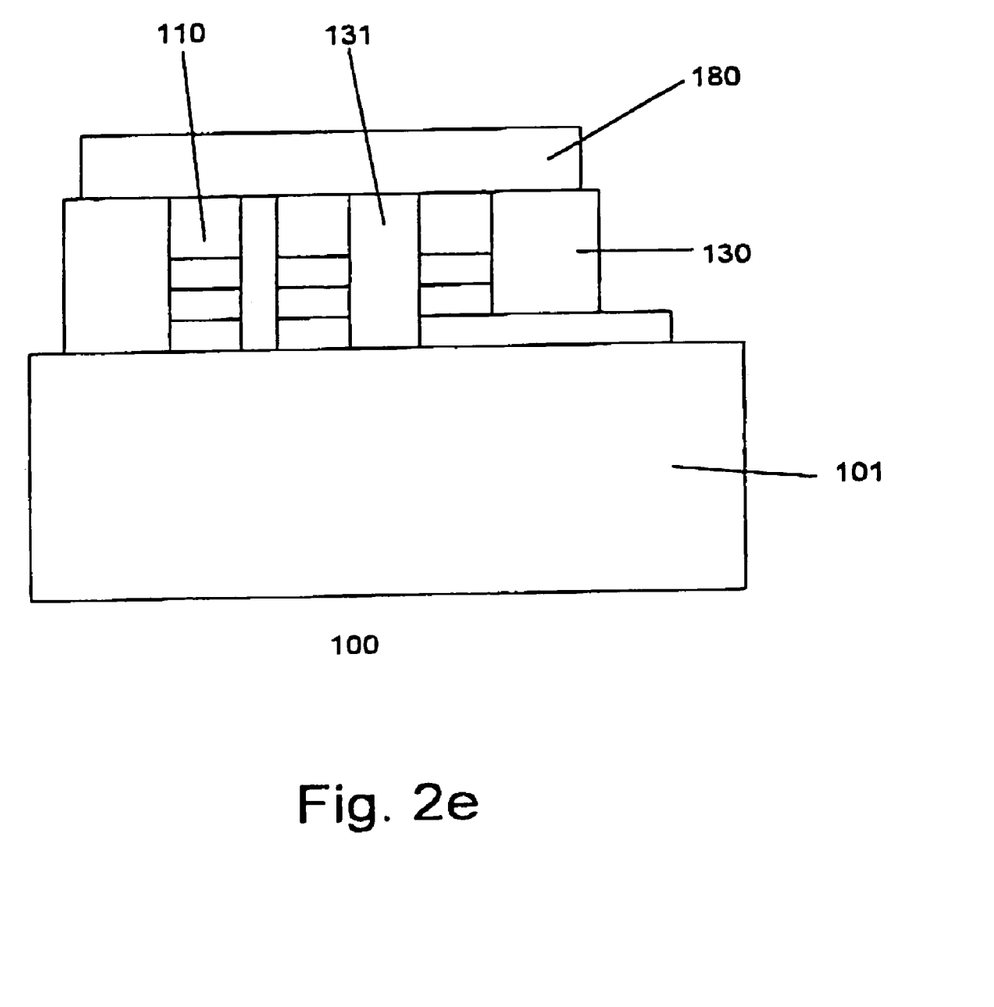

Referring to FIG. 2e, a cap 180 is mounted on the cap support to encapsulate the device. The cap layer comprises, for example, a metal or glass. Other types of cap which protect the active components from the environment, such as ceramic or metallized foil, are also useful. The cap is mounted onto the support post.

Various techniques can be used to mount the cap layer. In one embodiment, an adhesive is used to mount the cap layer. Adhesives such as self-hardening adhesives, UV or thermal curable adhesives, or hot melt adhesives are useful. Other techniques which employ low temperature solder materials, ultrasonic bonding, or welding techniques using inductance or laser welding are also useful.

Figure 3A:
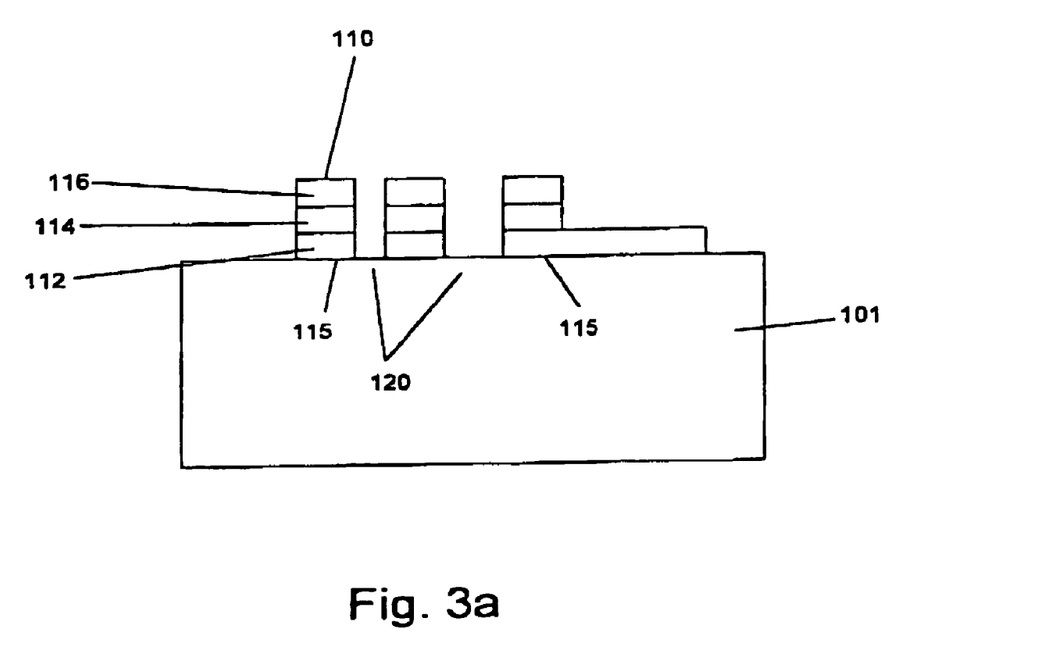
FIGS. 3a–3b show a process for fabricating an electronic device in accordance with another embodiment of the invention.
Figure 3B:
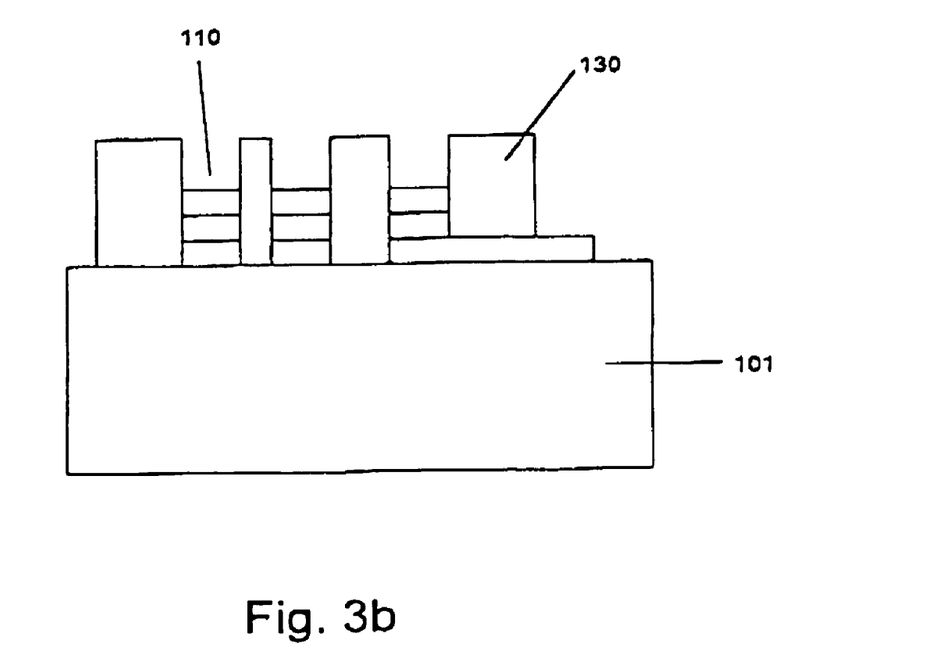

FIGS. 3a–3b show an alternative process for fabricating a device. Referring to FIG. 3a, a substrate 101 comprising active components 110 formed on its surface is provided. The active components, in one embodiment, comprise organic LED pixels to form a pixelated device. The organic LED pixels are formed in the active regions 115. As shown, the organic LED pixels comprise first and second electrodes 112 and 116 separated by at least one organic layer 114.

Referring to FIG. 3b, a spacer layer is deposited on the substrate to cover the active components and non-active regions. The spacer layer is patterned to form a cap support 130 in the non-active regions 120 and in the periphery of the device. A cap 180 is mounted thereon to encapsulate the device, as described in FIG. 2e.

Figure 4A:
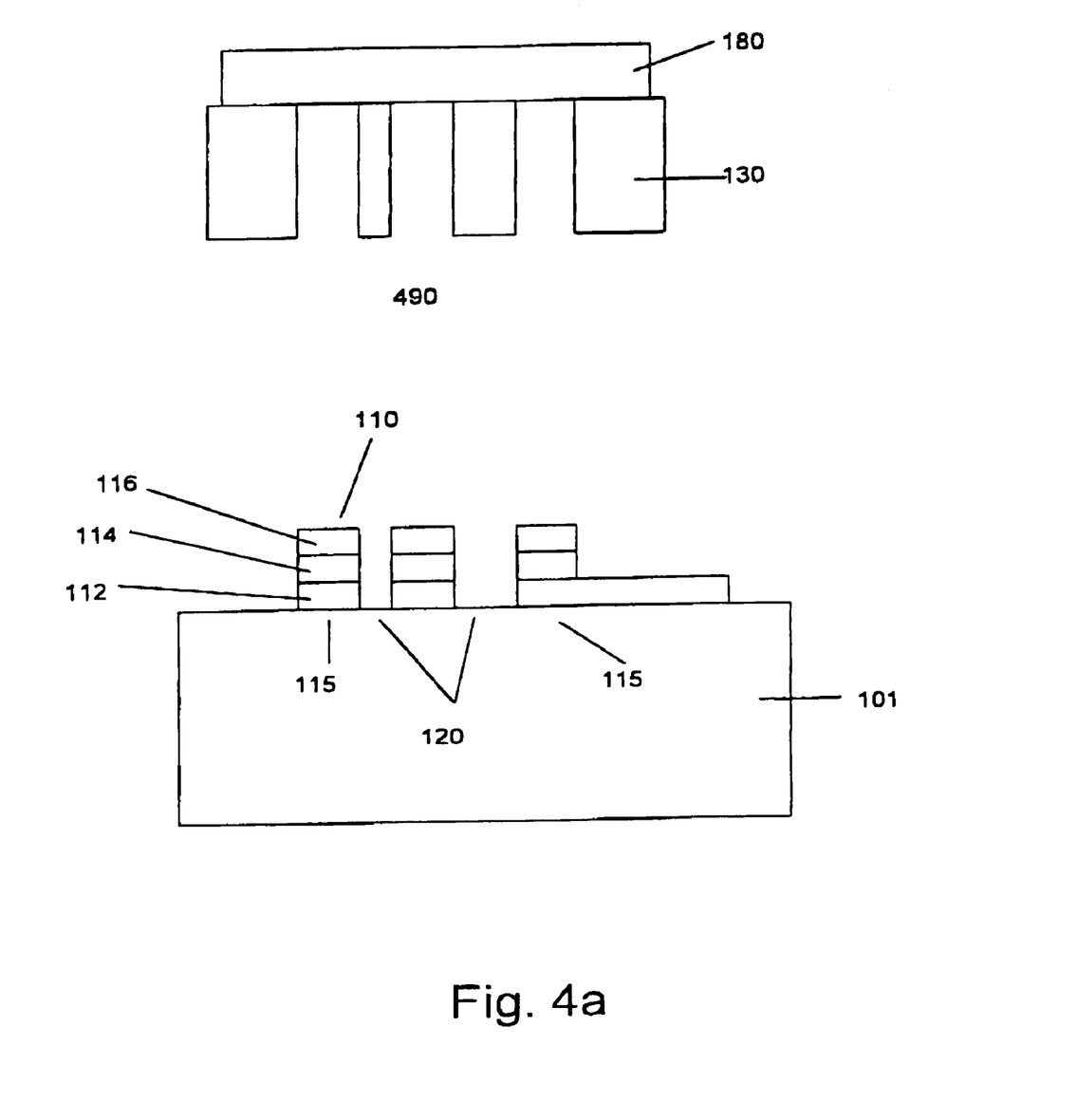
FIGS. 4a–4b show a process for fabricating an electronic device in accordance with one embodiment of the invention.
Figure 4B:
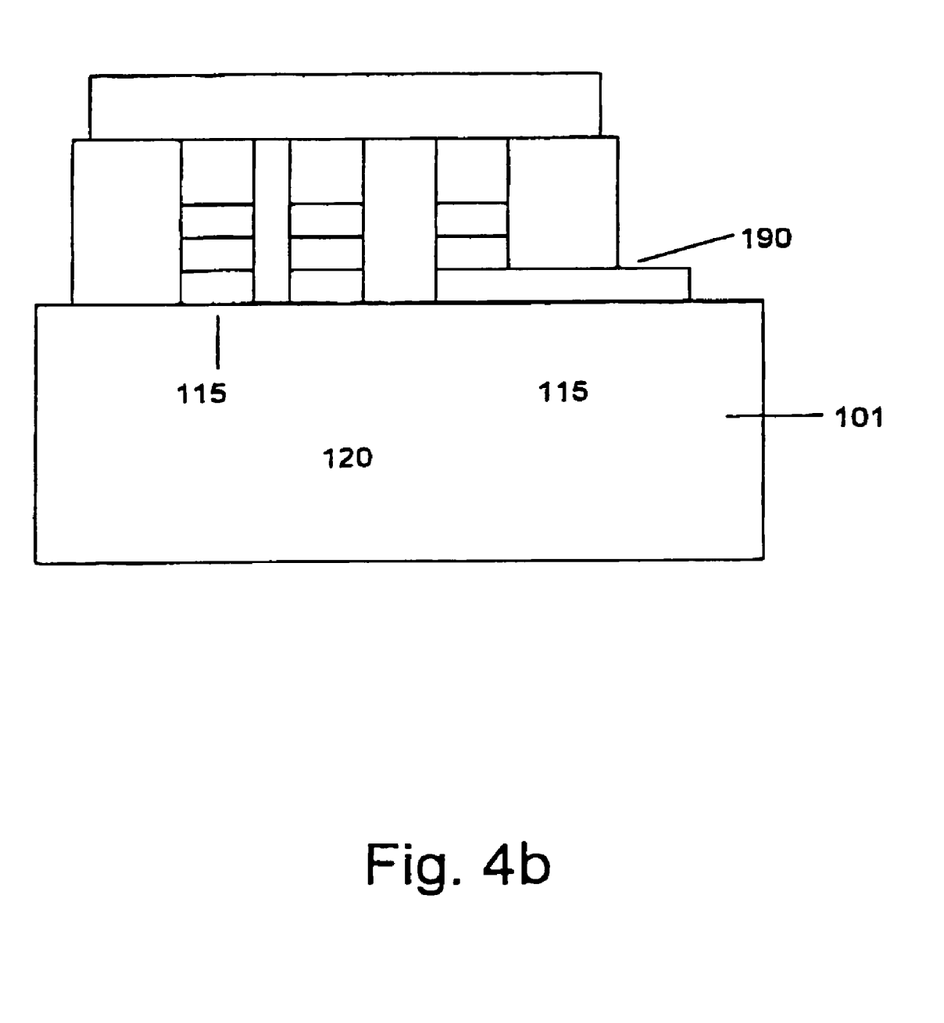

FIGS. 4a–4b show yet another process for forming the electrical device. Referring to FIG. 4a, a substrate 101 is provided with active components 110 formed thereon. In one embodiment, the active components comprise organic LED pixels of a pixelated LED device. The active components are formed over the active regions 115 of the substrate. The active components are separated by non-active regions 120.

A cap 490 is provided for encapsulating the device. The cap comprises a cap layer 180 with a cap support 130. The pattern of the cap support coincides with the non-active regions and the periphery of the device to surround the active components. In one embodiment, the cap is formed by depositing a spacer layer on the cap layer and selectively patterning it to form the cap support. The cap support can be formed with support posts having different height to accommodate features such as the pad 190, if necessary.

Referring to FIG. 4b, the cap is mounted onto the substrate, encapsulating the electrical device. Various techniques, such as those already described, can be used to mount the cap. The cap protects the active components from the environment, such as air and/or moisture.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for fabricating a device comprising:
providing a substrate;
defining one or more active and non-active regions on the substrate so that at least one non-active region is between two or more active regions and each of the active regions includes an active component; and
encapsulating the active regions with a cap supported by a cap support, the cap support located in at least one of the non-active regions and in a periphery of the active regions;
wherein the substrate, cap support and cap together form a flexible device.

2. The method of claim 1, wherein defining active regions on the substrate includes forming organic LED pixels.

3. The method of claim 1, wherein the cap includes the cap support.

4. The method of claim 1, wherein encapsulating the device forms a cavity between the active components and the cap which prevents the cap from contacting the active components.

5. The method of claim 4, wherein encapsulating the device hermetically seals the active components.

6. The method of claim 1, further comprising forming the cap support, including forming a spacer layer over the substrate and patterning the spacer layer to form the cap support.

7. The method of claim 6, wherein forming the spacer layer includes forming a layer of directly or indirectly photopatternable material.

8. The method of claim 7, wherein the directly photopatternable material is selected from a group consisting of photosensitive polyimide, photosensitive polybenzoxazole, photoresists, photoresists based on novolac systems, and dry film resist materials and the indirectly photopatternable material is selected from the group consisting of spin-on glass, polyimide, polybenzoxazole, polyglutarimide, benzocyclobutene, polymers, polyethylene, polystyrene, polypropylene, inorganic materials, $SiO_2$, $Si_3N_4$, and $AL_2O_3$.

9. The method of claim 6, wherein forming the active components in the active regions occurs after forming the cap support.

10. The method of claim 6, wherein forming the active components in the active regions occurs before forming the cap support.

11. The method of claim 6, wherein forming the cap support includes forming a cap support having a multi-layer architecture of at least first and second support layers.

12. The method of claim 11, wherein forming the first support layer comprises forming a dielectric material on the substrate, wherein the dielectric layer provides electrical isolation for the active components.

13. The method of claim 1, wherein defining one or more active regions includes:
forming a first electrode layer on the substrate;
patterning the first electrode layer to form first electrodes;
forming at least one organic layer over the first electrodes;
forming a second electrode layer over the organic layer; and
patterning the second electrode layer to form second electrodes.

14. The method of claim 1, wherein providing a substrate includes providing a semiconductor material.

15. The method of claim 1, wherein providing a substrate includes providing a plastic material.

16. The method of claim 1, wherein providing a substrate includes providing glass.

17. The method of claim 1, wherein encapsulating the device includes forming a cap comprising a material selected from the group consisting of glass, metal, ceramic, and metallized foil.

18. The method of claim 1, further comprising forming one or more support posts in the non-active regions.

19. The method of claim 18, wherein forming the one or more support posts forms support posts that provide support to a central portion of the cap.

* * * * *